(12) United States Patent
Kumagai et al.

(10) Patent No.: US 7,561,612 B2
(45) Date of Patent: Jul. 14, 2009

(54) LASER SOURCE DEVICE, IMAGE DISPLAY DEVICE EQUIPPED WITH THE LASER SOURCE DEVICE, AND MONITOR DEVICE

(75) Inventors: Keiko Kumagai, Suwa (JP); Minehiro Imamura, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 258 days.

(21) Appl. No.: 11/536,496

(22) Filed: Sep. 28, 2006

(65) Prior Publication Data

US 2008/0080185 A1 Apr. 3, 2008

(51) Int. Cl.
  *H01S 3/10* (2006.01)
  *H01S 3/081* (2006.01)
  *H01S 3/08* (2006.01)

(52) U.S. Cl. .............................. 372/100; 372/93; 372/22

(58) Field of Classification Search .................. 372/100, 372/93, 22
   See application file for complete search history.

(56) References Cited

U.S. PATENT DOCUMENTS

| | | | | |
|---|---|---|---|---|
| 3,914,012 | A | * | 10/1975 | Boughton .................. 359/375 |
| 5,761,227 | A | | 6/1998 | Hargis et al. |
| 6,009,110 | A | * | 12/1999 | Wiechmann et al. .......... 372/10 |
| 2006/0023173 | A1 | | 2/2006 | Mooradian et al. |
| 2006/0023757 | A1 | | 2/2006 | Mooradian et al. |
| 2006/0268241 | A1 | | 11/2006 | Watson et al. |
| 2006/0280219 | A1 | | 12/2006 | Shchegrov |
| 2007/0153862 | A1 | | 7/2007 | Shchegrov et al. |
| 2007/0153866 | A1 | | 7/2007 | Shchegrov et al. |

FOREIGN PATENT DOCUMENTS

| | | |
|---|---|---|
| JP | A 59-128525 | 7/1984 |
| JP | A-4-158588 | 6/1992 |
| JP | A 05-297431 | 11/1993 |
| JP | A 07-086668 | 3/1995 |
| JP | A-2001-108809 | 4/2001 |
| JP | B2 3300429 | 4/2002 |

OTHER PUBLICATIONS

Mooradian et al., "High Power Extended Vertical Cavity Surface Emitting Diode Lasers and Arrays and Their Applications," Micro-Optics Conference, Tokyo, Nov. 2, 2005, p. 1-4.

* cited by examiner

*Primary Examiner*—Minsun Harvey
*Assistant Examiner*—Marcia A. Golub
(74) *Attorney, Agent, or Firm*—Oliff & Berridge, PLC

(57) ABSTRACT

A laser source device provided with a light source, a wavelength conversion element, an external resonator, and an optical path conversion element. The wavelength conversion element is disposed inside the resonance structure, the second laser beam is taken out on the second optical path by the optical path conversion element and is led to a direction substantially the same as the proceeding direction of the first laser beam, and is used with the first laser beam as the output light beam. The selectively reflective film and the reflective surface for taking out the second laser beam are integrated.

16 Claims, 9 Drawing Sheets

LASER SOURCE DEVICE, IMAGE DISPLAY DEVICE EQUIPPED WITH THE LASER SOURCE DEVICE, AND MONITOR DEVICE

BACKGROUND

The present invention relates to a laser source device for emitting a laser beam, an image display device equipped with the laser source device, and a monitor device.

In recent years, a laser source device is widely used in the opto-electronics field such as an optical communication, an optical application measurement, or an optical display.

As such laser source devices, there are cited those applying the wavelength of the fundamental laser without modification and those applying the wavelength of the fundamental laser with modification. In the latter laser source devices, a second harmonic generation (SHG) element is known as an element for performing wavelength conversion of the fundamental laser.

Here, since the conversion efficiency of the SHG is generally around a few %, the power of the light converted by the SHG element is substantially reduced in comparison with the power of the output light of the fundamental laser source. Therefore, as a configuration for suppressing the power reduction of the output light, there is proposed a laser source device as in a patent document 1. In the laser source device, a light beam emitted from an internal resonance type of laser source and transmitted through the SHG element is separated into a first SHG light beam having a converted wave length and a residual fundamental light beam. Then, the residual fundamental light beam is led through the SHG element again, thereby taking out a second SHG light beam having a converted wavelength. The second SHG light beam is combined with the first SHG light beam in a condition in which the second SHG light beam is converted into a polarized light beam having a polarization direction 90° different from the first SHG light beam. In the laser source device of the patent document 1, by thus utilizing the composite light beam of the first SHG light beam and the second SHG light beam as the output light, the power reduction of the output light beam is suppressed.

[Patent Document 1] JP-A-59-128525 the third official gazette

SUMMARY

Although, in the laser source device described in the patent document 1, the second SHG light beam having a converted wavelength can be utilized by transmitting the residual fundamental light beam again through the SHG element, it is not possible to utilize the residual fundamental light beam that is not converted even by transmitting again through the SHG element. Therefore, the efficiency of the light beam is not dramatically improved. Further, if such a residual fundamental light beam is directly returned to the fundamental laser source, the power of the fundamental laser source might be lowered or become unstable, and accordingly, the configuration for preventing the residual fundamental light beam from returning to the light source becomes indispensable. Therefore, there is a possibility that the optical system grows in size. Further, since the length of the optical path grows, or the number of times of the passage through an optical element increases, there is also a possibility of generation of a light loss.

Further, since in the laser source device described in the patent document 1, the first SHG light beam and the second SHG light beam are set in the condition of having polarization directions 90° different from each other for combining with each other, the output light beam becomes a composite light beam of two kinds of polarized light beams. Therefore, if it is considered that the laser source device described in the patent document 1 is used in combination with a polarization control type of device (e.g., liquid crystal device), which can only utilize one kind of polarized light beam, either one of the SHG light beams can only be utilized unless a configuration for uniforming the polarization directions of the first SHG light beam and the second SHG light beam is provided.

In other words, although in the laser source device described in the patent document 1, it is possible to obtain a stable output while suppressing the power reduction of the output light beam to some extent, the light efficiency is not so dramatically improved. In particular, if it is used in combination with the polarization control type of device, there is a possibility that the light efficiency is not at all improved.

Therefore, the invention has been made in view of the above circumstances, and has an object of providing a laser source device capable of efficiently suppressing the power drop of the output light beam, having high light efficiency, having the output light beam with aligned polarization directions, and offering a stable output. Further, it is another object to provide an image display device and a monitor device with improved light efficiency by utilizing such a laser source device.

A laser source device according to the invention includes a light source for emitting a light beam with a first wavelength, an external resonator for selectively reflecting the light beam with the first wavelength to lead the light beam towards the light source, a wavelength conversion element disposed on a first optical path formed between the light source and the external resonator, and for converting a wavelength of a part of the incident light beam with the first wavelength into a second wavelength different from the first wavelength, and an optical path conversion element for taking out the light beam converted into the second wavelength in the process in which the light beam is reflected by the external resonator to proceed towards the light source on a second optical path different from the first optical path, wherein a first laser beam with the second wavelength emitted from the external resonator and a second laser beam with the second wavelength emitted from the optical path conversion element are used as an output light beam, the optical path conversion element includes, a selectively reflective film disposed between the light source and the wavelength conversion element, and for selectively reflecting the light beam with the second wavelength, a reflective surface for reflecting the light beam reflected by the selectively reflective film to lead the light beam in a direction substantially the same as the proceeding direction of the first laser beam, and a translucent member for integrating the selectively reflective film and the reflective surface.

According to the invention, the wavelength conversion element is disposed in the resonance structure (the first optical path) composed of the light source and the external resonator to utilize the second laser beam converted in the wavelength in the process in which it is reflected by the external resonator to proceed towards the light source by taking out on the second optical path by the optical path conversion element, thereby making it possible to efficiently reduce the power reduction of the output light beam. Further, since in the invention the wavelength conversion element is disposed inside the resonance structure composed of the light source and the external resonator, the structure for preventing the light beam, which is not converted into the second wavelength in the process in which it is reflected by the external resonator to proceed towards the light source, from retuning to the light source is not necessary. Therefore, there is a little possibility of growing the optical system in size, and the light loss caused by elongation of the optical path or increase in the number of passages through the optical elements can be reduced. Further, since in the invention it is sufficient only to set the second laser beam to a direction substantially the same as the proceeding direction of the first laser beam, the output light beams with substantially aligned polarization directions can be obtained. Therefore, even in the case in which it is used in combination with a polarization control type of device, the efficiency of the light beam can be improved. Further, the power of the output light beam can easily be affected by the displacement between the selectively reflective film and the reflective surface. However, since in the invention, they are integrated by the translucent member, alignment between the selectively reflective film and the reflective film is not necessary, and since no displacement is caused between the selectively reflective film and the reflective film, it is also possible to obtain a stable output.

In conclusion, according to the present invention, the laser source device, capable of efficiently suppressing the power reduction of the output light beam, having high light efficiency, having the output with aligned polarization directions, and having a stable output can be obtained.

In the laser source device according to the invention, it is preferable that the translucent member includes a first prism and a second prism, the first and second prisms each have a first surface and a second surface, the selectively reflective film is disposed between the second surface of the first prism and the first surface of the second prism, the light beam emitted from the light source enters the optical path conversion element from the first surface of the first prism, passes through the second surface of the first prism, the selectively reflective film, the first surface of the second prism in this order, and is emitted from the second surface of the second prism towards the wavelength conversion element, the light beam reflected by the external resonator and proceeding towards the light source enters the optical path conversion element from the second surface of the second prism, passes through the first surface of the second prism, and enters the selectively reflective film, the light beam passing through the selectively reflective film and proceeding towards the light source out of the light beam, which is reflected by the external resonator and proceeds towards the light source, passes through the second surface of the first prism, and is emitted from the first surface of the first prism towards the light source, and the light beam reflected by the selectively reflective film out of the light beam reflected by the external resonator and proceeding towards the light source is reflected by the reflective surface, and is emitted from the second surface of the second prism.

According to the configuration described above, since it is possible to make the light beam enter the optical path conversion element or to make the light beam be emitted from the optical path conversion element via the surfaces of the prisms, it is easy to control the directions of the light beams entering the optical path conversion element or emitted from the optical path conversion element.

In particular, in the case in which the first surface of the first prism and the second surface of the second prism are parallel to each other, it is possible to make the directions of the light beam entering the optical path conversion element and the light beam emitted from the optical path conversion element the same, it becomes easier to control the directions of the light beams.

Further, in this case, the reflective surface can be composed of a third surface of the second prism, and the third surface is preferably a smoothed plane disposed at an angle satisfying a total reflection condition with the incident light beam to the third surface. According to the configuration described above, since the reflective efficiency of the reflective surface can be improved to nearly 100%, the light efficiency can further be improved.

Further, in this case, the reflective surface can be composed of a third surface of the second prism. According to such a configuration, since there is no need for setting the third surface at the angle satisfying the total reflection condition, the freedom of designing the optical path increases.

In the laser source device according to the invention, it is preferable that the translucent member is a plate-like member provided with a first surface and a second surface, the selectively reflective film is disposed on the first surface of the plate-like member, and the reflective surface is a reflective film provided on the second surface of the plate-like member.

According to the configuration described above, the lighter-weight optical path conversion element than in the case in which the prism is used as the translucent member can be obtained. Further, the plate-like member can be processed more easily in comparison with the prism. Therefore, it can contribute to weight saving and cost reduction of the laser source device.

In the laser source device according to the invention, it is preferable that the translucent member is composed of a prism provided with a first, a second, and a third surfaces, the selectively reflective film is disposed on the first surface, the light beam emitted from the light source enters the optical path conversion element from the first surface via the selectively reflective film, and is emitted from the second surface towards the wavelength conversion element, the light beam reflected by the external resonator and proceeding towards the light source enters the optical path conversion element from the second surface, passes through the first surface, and enters the selectively reflective film, the light beam transmitted through the selectively reflective film out of the light beam reflected by the external resonator and proceeding towards the light source proceeds towards the light source, the light beam reflected by the selectively reflective film out of the light beam reflected by the external resonator and proceeding towards the light source is reflected by the third surface, and is emitted from the second surface.

According to the configuration described above, since the optical path conversion element can be composed of only one prism and the selectively reflective film, the number of composing parts is reduced, thus contributing to the cost reduction of the laser source devices.

Further, in this case, the reflective surface can be composed of the third surface, the third surface is preferably a smoothed plane disposed at an angle satisfying a total reflection condition with the incident light beam to the third surface. According to the configuration described above, since the reflective efficiency of the reflective surface can be improved to nearly 100%, the light efficiency can further be improved.

Further, in this case, the reflective surface can be composed of a reflective film provided on the third surface. According to such a configuration, since there is no need for setting the third surface at the angle satisfying the total reflection condition, the freedom of designing the optical path increases.

In the laser source device according to the invention, it is preferable that a first laser beam with the second wavelength emitted from the external resonator and a second laser beam with the second wavelength emitted from the optical path conversion element are substantially parallel to each other.

The laser source device according to the present invention has a high probability of being applied in combination with other optical devices such as a lens, a filter, a mirror, a diffraction grating, a prism, a light modulation element, and the most of these optical devices are varied in the characteristics or changed in the output result depending on the angle of the incident light beam. Therefore, by setting the first laser beam and the second laser beam to substantially parallel to each other, it becomes easy to design or dispose the optical devices positioned posterior to the laser source device. Therefore, according to the configuration described above, if the laser source device according to the present invention is applied to an image display device, a monitor device, or the like, the advantage of dramatically increasing the amount of freedom of the optical design is obtained.

Further, in this case, assuming that the width of the wavelength conversion element in the direction parallel to a line perpendicular to the first laser beam and the second laser beam is W1, and the distance between the first laser beam and the second laser beam is W2, W2>W1 is preferably satisfied.

According to the above configuration, even if there is caused a displacement in the relative positions of the first optical path and the selectively wavelength film, the second optical path is not blocked by the wavelength conversion element. Therefore, the alignment of the optical path conversion element becomes relatively easy.

In the laser source device according to the invention, it is preferable that the light source includes a plurality of light emitting sections disposed as an array. In the present invention, even if such a light source formed as an array is used, it is sufficient only to extend the areas of the light entrance and emission end surfaces of the selectively reflective film, the reflective surface, the wavelength selection element, and the external resonator to the areas corresponding to the array. As described above, in the invention, even if the light source is formed as an array, it is possible to cope with the light source with a simple configuration without causing any excessive growth in size of the device. Therefore, in the invention, even if the light source is formed as an array, it is possible to make increase in the amount of light derived from using the array efficiently lead improvement of the power of the output light beam while keeping the advantage of making it possible to provide the laser source device capable of efficiently suppressing the power reduction of the output light beam, having high light efficiency, having the output light beam with aligned polarization directions, and having a stable output.

Further, in the laser source device according to the invention, it is preferable that the wavelength conversion element is a quasi phase control type of wavelength conversion element. Since the quasi phase control type of wavelength conversion element has higher conversion efficiency than other types of wavelength conversion elements, the advantage of the invention can further be enhanced.

An image display device according to the invention includes the laser source device described above, a light modulation element for modulating a laser beam emitted from the laser source device in accordance with image information.

Further, a monitor device according to the invention includes the laser source device described above, image pickup means for imaging an object irradiated by the laser source device.

Since the image display device and the monitor device described above use the laser source device described above, the light efficiency can be enhanced.

BRIEF DESCRIPTION OF THE DRAWINGS

Embodiments of the invention will hereinafter be explained with reference to the accompanying drawings.

DETAILED DESCRIPTION OF EMBODIMENTS

First Embodiment

Figure 1:
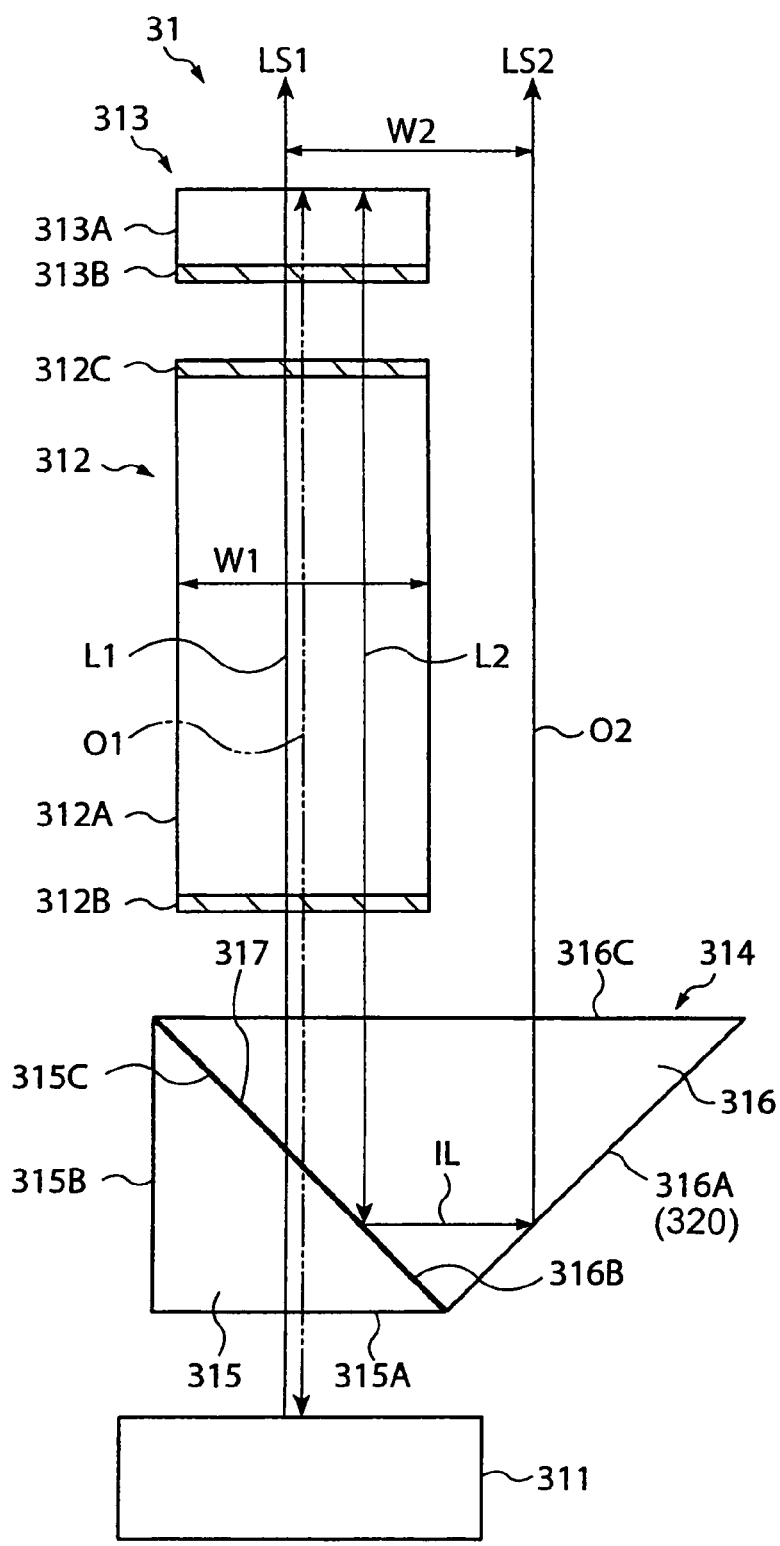
FIG. 1 is a schematic diagram showing a general configuration of a laser source device relating to a first embodiment.

FIG. 1 is a schematic diagram showing a general configuration of a laser source device relating to a first embodiment. A laser source device 31 is provided with a light source 311, a wavelength conversion element 312, an external resonator 313, and an optical path conversion element 314. The light source 311 emits a light beam with a first wavelength.

Figure 2:
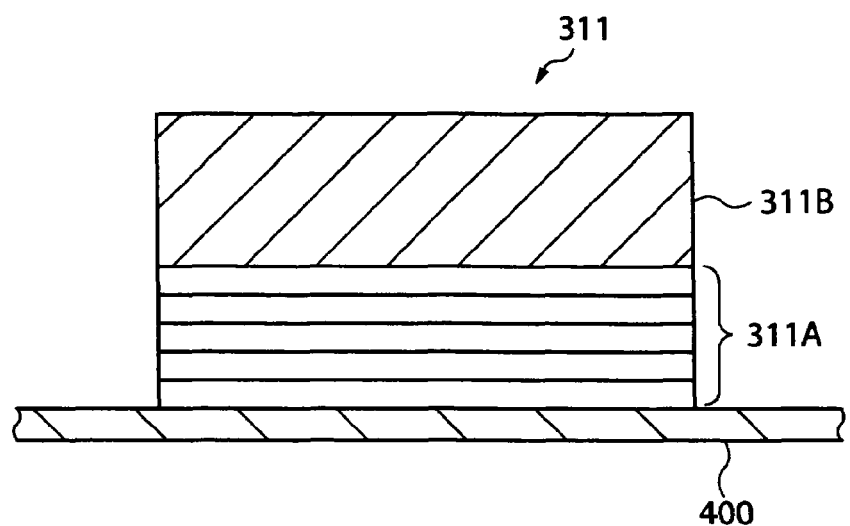
FIG. 2 is a cross-sectional view schematically showing a structure of a light source.

FIG. 2 is a cross-sectional view schematically showing a structure of the light source 311. The light source 311 shown in FIG. 2 is a so-called surface emission semiconductor laser, and is provided with a substrate 400 formed of, for example, a semiconductor wafer, a mirror layer 311A formed on the substrate 400 and having a function as a reflection mirror, and a laser medium 311B stacked on the surface of the mirror layer 311A.

The mirror layer 311A is composed of a layered body of dielectrics with a high refractive index and dielectrics with a low refractive index formed on the substrate 400 by, for example, chemical vapor deposition (CVD). The thickness of each of the layers forming the mirror layer 311A, the material of each of the layers, and the number of the layers are optimized for the wavelength (a first wavelength) of the light beam emitted from the light source 311, and is set to be a condition in which the reflected light beams interfere with each other and reinforce each other.

The laser medium 311B is formed on the surface of the mirror layer 311A. This laser medium 311B is provided with current supply means connected thereto not shown in the drawings, and emits a light beam with a predetermined wavelength in response to a predetermined amount of current flowing from the current supplying means. Further, the laser medium 311B amplifies a light beam with a specific wavelength (the first wavelength) by resonating the light beam with the first wavelength between the mirror layer 311A and the external resonator 313 shown in FIG. 1. In other words, the light beam reflected by the mirror layer 311A or the external resonator 313 described later resonates with the light beam newly emitted by the laser medium 311B to be amplified, and emitted from a light emission end surface of the laser medium 311B in a direction substantially perpendicular to the mirror layer 311A or the substrate 400.

The wavelength conversion element 312 converts the wavelength of the incident light beam into a wavelength (a second wavelength) half as large as the wavelength of the incident light beam. The wavelength conversion element 312 is provided, as shown in FIG. 1, on a first optical path O1 formed between the light source 311 and the external resonator 313.

Figure 3:
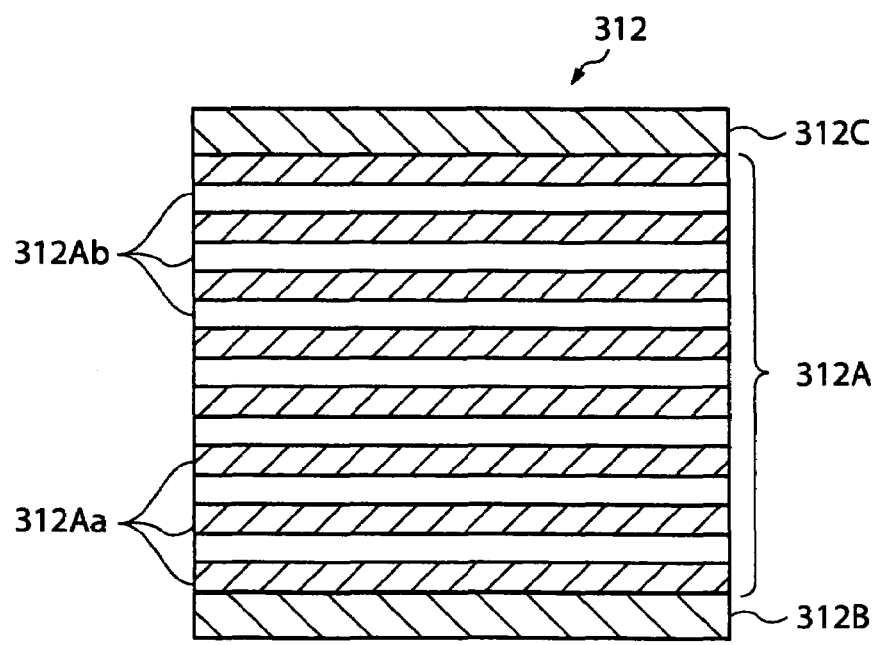
FIG. 3 is a cross-sectional view schematically showing a structure of a wavelength conversion element.

FIG. 3 is a cross-sectional view schematically showing a structure of the wavelength conversion element 312. The wavelength element 312 has, for example, a quadratic prism shape, and is provided with a wavelength conversion section 312A, an anti-reflective (AR) film 312B formed on the light source 311 side surface (an entrance end surface) of the wavelength conversion section 312A, and an AR film 312C formed on the external resonator 313 side surface (an emission end surface) of the wavelength conversion section 312A.

The wavelength conversion section 312A is a second harmonic generation (SHG) element, which generates the second harmonic wave of the incident light beam. The wavelength conversion section 312A is provided with a periodical polarization inversion structure, and converts the wavelength of the incident light beam into a wavelength (a second wavelength) half as large as the wavelength of the incident light beam with the wavelength conversion by quasi phase matching (QPM). For example, if the wavelength (the first wavelength) of the light beam emitted from the light source 311 is 1064 nm (near infrared), then the wavelength conversion section 312A converts it into a half wavelength (the second wavelength) of 532 nm to generate a green light beam. It should be noted that, as already described in the background art section, the wavelength conversion efficiency of the wavelength conversion section 312A is typically around a few %. In other words, all of the light beams emitted from the light source 311 are not necessarily converted into the light beams with the second wavelength.

The periodical polarization inversion structure is formed inside a crystal substrate of an inorganic nonlinear optical material such as lithium niobate (LN: $LiNbO_3$) or lithium tantalate (LT: $LiTaO_3$). Specifically, the periodic polarization inversion structure has a configuration in which two areas 312Aa, 312Ab having polarization directions inverted from each other are alternately formed in a predetermined distance in a direction substantially perpendicular to the light beam emitted from the light source 311. The pitch of these areas 312Aa, 312Ab is appropriately determined considering the wavelength of the incident light beam and the refractive index dispersion of the crystal substrate.

It should be noted that, in general, a laser beam emitted by oscillation of a semiconductor laser oscillates in plural modes within the gain band, and their wavelengths vary in consequence of variation in temperature and so on. Specifically, the allowable range of the wavelength of the light beam converted in the wavelength conversion element 312 is about 0.3 nm, which varies for 0.1 nm/° C. with respect to the variation in the temperature of the use environment.

The AR films 312B, 312C are, for example, single layered or multilayer dielectric films, and transmit both of the light beam having the first wavelength and the light beam having the second wavelength with a transmission of, for example, no lower than 98%. It should be noted that these AR films 312B, 312C can be omitted because they are not the indispensable components for achieving the function of the wavelength conversion element 312. In other words, the wavelength conversion element 312 can be configured only with the wavelength conversion section 312A.

The external resonator 313 has a function of selectively reflecting the light beam with the first wavelength to lead it towards the light source 311 and transmitting the light beam with other wavelengths (including the second wavelength). The external resonator 313 also assumes the function of narrowing the bandwidth of the wavelength of the light beam to be amplified by selectively reflecting the light beam with the first wavelength. The external resonator 313 is, as shown in FIG. 1, disposed on the first optical path O1 so as to be substantially perpendicular to the first optical path O1. Further, the entrance end surface thereof faces the emission end surface of the wavelength conversion element 312.

Figure 4:
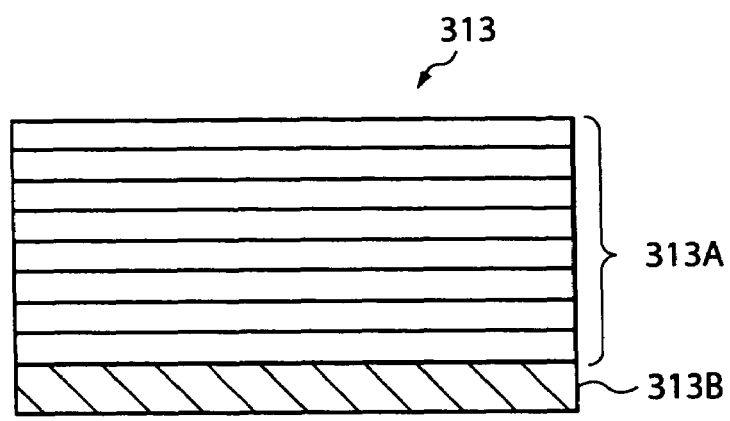
FIG. 4 is a cross-sectional view schematically showing a structure of an external resonator.

FIG. 4 is a cross-sectional view schematically showing a structure of an external resonator. The external resonator 313 also has a quadratic prism shape similarly to the wavelength conversion element 312. Further, a Bragg grating section 313A as a volume phase grating having a Bragg grating structure formed inside thereof and an anti-reflective (AR) film 313B formed on the end surface (entrance end surface) of the wavelength conversion element 312 are provided.

The Bragg grating section 313A is composed of a number of layers disposed along the optical path O1.

The Bragg grating section 313A is a glass layer having interference patterns with different refractive indexes formed as layers by irradiating a glass layer made mainly of $SiO_2$ such as alkali boro-aluminosilicate glass with an ultraviolet beam having a predetermined wavelength. The function of the external resonator 313 described above is derived from this Bragg grating 313A.

The AR film 313B is a single layered or multilayer dielectric film, and transmit both of the light beam having the first wavelength and the light beam having the second wavelength with a transmission of, for example, no lower than 98%. The AR film 313B can be formed not only on the entrance end surface of the Bragg grating section 313A but also on the emission end surface thereof. It should be noted that the AR film 313B can be omitted because it is not the indispensable component for achieving the function of the external resonator 313. In other words, the external resonator 313 can be configured only with the Bragg grating section 313A.

Figure 5:
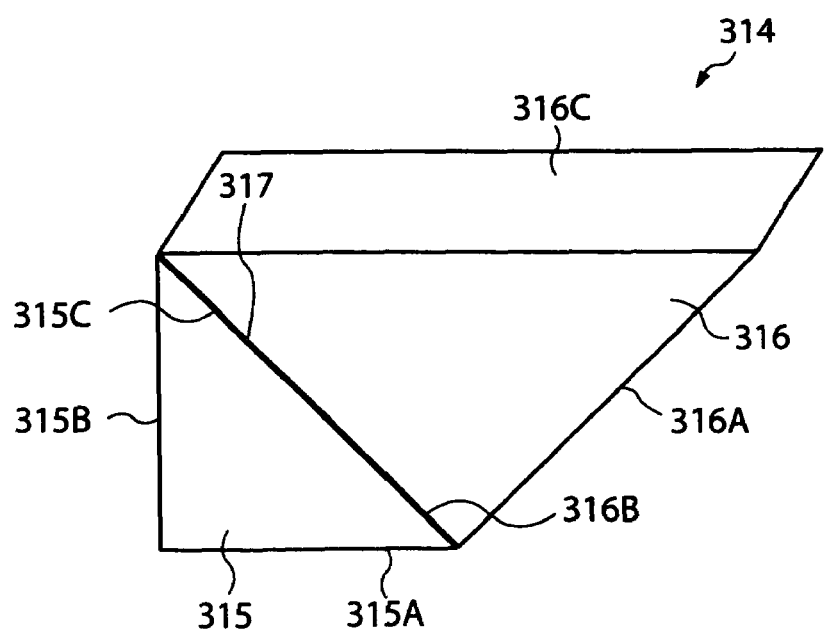
FIG. 5 is a perspective view of an optical path conversion element.

FIG. 5 is a perspective view of the optical path conversion element 314. The optical path conversion element 314 is, as shown in FIGS. 1 and 5, provided with first and second prisms 315, 316 as translucent members and a selectively reflective film 317 disposed between them.

The first prism 315 is made of optical glass such as BK7, and has an isosceles triangular prism shape. The side surfaces of this prism 315 is composed of surfaces 315A, 315B including two sides forming the apex angle of the isosceles triangle and a surface 315C including the hypotenuse.

The surface 315A of the prism 315 is, as shown in FIG. 1, disposed so as to face the light source 311. Further, the surface 315A is disposed so as to be substantially perpendicular to the first optical path O1. Still further, the surface 315A and a surface 316C of the prism 316 described later are parallel to each other.

The surface 315C is provided with the selectively reflective film 317 formed thereon. This selectively reflective film 317 is composed of, for example, a dielectric multilayer film.

Such a dielectric multilayer film can be formed by, for example, CVD, and the thickness of each layer forming the multilayer film, the material of each layer, and the number of the layers are optimized in accordance with the required characteristics. The selectively reflective film 317 is disposed between the light source 311 and the wavelength conversion element 312, and has a property of selectively reflecting the light beam with the second wavelength while transmitting the light beam with the first wavelength. Although the higher, the better, the transmission for the light beam with the first wavelength and the reflectance for the light beam with the second wavelength of the selectively reflective film 317 are, 80% is sufficient for them.

The second prism 316 is, similarly to the prism 315, made of optical glass such as BK7, and has an isosceles triangular prism shape. The side surfaces of this prism 316 is composed of surfaces 316A, 316B including two sides forming the apex angle of the isosceles triangle and a surface 316C including the hypotenuse. The length of the two sides forming the apex angle of the isosceles triangle forming the prism 316 is roughly equal to the length of the hypotenuse of the isosceles triangle forming the prism 315.

The surface 316B of the prism 316 is bonded with the surface 315C of the prism 315 provided with the selectively reflective film 317 formed thereon with, for example, an optical adhesive cured by ultraviolet beam irradiation. The surface 316C is disposed so that a part thereof faces the wavelength conversion element 312. Further, the surface 316C is disposed so as to be substantially perpendicular to the first optical path O1. The surface 316A is a smoothed surface disposed at an angle satisfying the total reflection condition with the incident light beam IL (see FIG. 1).

The surface 316C and the selectively reflective film 317 are integrated by bonding the prisms 315 and 316 with each other. It should be noted that the prisms 315 and 316 can be integrated by other method than the bonding.

It should be noted that the selectively reflective film 317 can be formed on the surface 316B of the prism 316 instead of the surface 315C of the prism 315. In conclusion, it is sufficient that the selectively reflective film 317 is disposed between the surface 315C of the prism 315 and the surface 316B of the prism 316. Further, anti-reflective (AR) films can be formed on the surface 315A of the prism 315 and the surface 316C of the prism 316. By forming the AR films on these surfaces, it becomes possible to reduce the light loss when the light beam enters the optical path conversion element 314 or is emitted from the optical path conversion element 314 through these surfaces.

A process to obtain the output light beam from the laser source device 31 will be explained next with reference to FIGS. 1 through 5.

The light source 311 emits light beam with the first wavelength when an electrical current is made to flow through the laser medium 311B.

The light beam with the first wavelength emitted from the light source 311 enters the optical path conversion element 314 from the surface 315A of the prism 315, passes through the surface 315C of the prism 315, the selectively reflective film 317, and the surface 316B of the prism 316 in this order, and is emitted from the surface 316C of the prism 316 towards the wavelength conversion element 312.

The light beam with the first wavelength emitted from the optical path conversion element 314 enters the wavelength conversion element 312.

In the wavelength conversion element 312, the wavelength of a part of the light beam with the first oscillation wavelength entering therein is converted into a wavelength (the second wavelength) half as large as the wavelength.

The light beam converted into the second wavelength out of the light beams emitted from the wavelength conversion element 312 is transmitted through the external resonator 313, and then emitted from the external resonator 313 as the first laser beam LS1.

On the other hand, the light beam (the light beam with the first wavelength), which is not converted into the second wavelength, out of the light beams emitted from the wavelength conversion element 312 is reflected by the external resonator 313, and proceeds towards the light source 311. The light beam with the first wavelength reflected by the external resonator 313 is transmitted through the wavelength conversion element 312 again in the process of proceeding towards the light source 311. Then, a part of the light beam is converted into the second wavelength.

The light beam emitted from the wavelength conversion element 312 towards the light source 311 then enters the optical path conversion element 314 from the surface 316C of the prism 316, and enters the selectively reflective film 317 through the surface 316B of the prism 316.

The light beam with the first wavelength out of the light beams thus entering the selectively reflective film 317 is transmitted through the selectively reflective film 317.

Subsequently, the light beam with the first wavelength transmitted through the selectively reflective film 317 is transmitted through the surface 315C of the prism 315, and emitted from the surface 315A of the prism 315 towards the light source 311. Further, the light beam returns to the light source 311, and is reflected by the mirror layer 311A to be emitted again from the light source 311. As described above, the light beam with the first wavelength is amplified by resonating with the light beam newly emitted by oscillation of the laser medium 311B by reciprocating the first optical path O1 formed between the light source 311 and the external resonator 313. In other words, the laser source device 31 is provided with the resonance structure formed between the mirror layer 311A of the light source 311 and the external resonator 313.

On the other hand, the light, which is converted into the second wavelength by the wavelength conversion element 312 in the process that it is reflected by the external resonator 313 and then proceeds towards the light source 311, is reflected by the selectively reflective film 317.

Then, it is reflected by the surface 316A as a reflective surface of the prism 316, and led towards a direction substantially parallel to the proceeding direction of the first laser beam LS1. Further, the light beam reflected by the surface 316A is emitted from the surface 316C of the prism 316 as a second laser beam LS2.

In other words, the optical path conversion element 314 is provided with a function of taking out the light, which is converted into the second wavelength in the process in which it is reflected by the external resonator 313 to proceed towards the light source 311, on the second optical path O2 different from the first optical path O1.

Further, the optical path conversion element 314 can be composed of a prism other than the isosceles triangular prism as long as such a function can be achieved.

It should be noted that in FIG. 1, L1 denotes the light beam emitted from the light source 311, converted into the light beam with the second wavelength by the wavelength conversion element 312, and then emitted from the external resonator 313 as the first laser beam LS1. The optical path O1 denotes the light beam emitted from the light source 311, emitted by the wavelength conversion element 312 without being converted into the second wavelength, not converted into the second wavelength by the wavelength conversion element 312 also in the process in which it is reflected by the external resonator 313 to proceed towards the light source 311, and returning to the light source 311 through the selectively reflective film 317. It can be thought that the optical path O1 is formed by such a light beam. Further, L2 denotes the light beam emitted from the light source 311, emitted by the wavelength conversion element 312 without being converted into the second wavelength, converted by the wavelength conversion element 312 into the second wavelength in the process in which it is reflected by the external resonator 313 to proceed towards the light source, and then entering the selectively reflective film 317. Although L1, O1, and L2 are illustrated at different positions in FIG. 1, they are illustrated at different positions only for the sake of convenience of explanations, and exist at the same positions in the normal situation.

Finally, the relationship between the distance between the first laser beam LS1 and the second laser beam LS2, and the width of the wavelength conversion element 312 will be explained with reference to FIG. 1. In FIG. 1, W1 denotes the width of the wavelength conversion element 312 in the direction parallel to a line (not shown) perpendicular to both of the first laser beam LS1 and the second laser beam LS2. W2 denotes the distance between the first laser beam LS1 and the second laser beam LS2. The laser source device 31 according to the preset embodiment is configured to have the relationship of W2>W1.

The laser source device 31 according to the present embodiment brings the following advantages.

(1) The wavelength conversion element 312 is disposed in the resonance structure (the first optical path O1) composed of the light source 311 and the external resonator 313 to utilize the second laser beam converted in the wavelength in the process in which it is reflected by the external resonator 313 to proceed towards the light source 311 by taking out on the second optical path O2 by the optical path conversion element 314, thereby making it possible to efficiently reduce the power reduction of the output light beam. Further, since the wavelength conversion element 312 is disposed inside the resonance structure composed of the light source 311 and the external resonator 313, the structure for preventing the light beam, which is not converted into the second wavelength in the process in which it is reflected by the external resonator 313 to proceed towards the light source 311, from retuning to the light source 311 is not necessary. Therefore, there is a little possibility of growing the optical system in size, and the light loss caused by elongation of the optical path or increase in the number of passages through the optical elements can be reduced. Further, since it is sufficient only to set the second laser beam LS2 to a direction substantially the same as the proceeding direction of the first laser beam LS1, the output light beams with substantially aligned polarization directions can be obtained. Therefore, even in the case in which it is used in combination with a polarization control type of device, the efficiency of the light beam can be improved. Still further, although the power of the output light beam can easily be affected by variations in the positions of the selectively reflective film 317 and the surface 316A as the reflective surface, since these are integrated by the prisms 315, 316, the alignment between the selectively reflective film 317 and the surface 316A is not necessary, and further, no displacement is caused between the selectively reflective film 317 and the surface 316A, thus a stable output can also be obtained.

In conclusion, according to the present embodiment, the laser source device 31, capable of efficiently suppressing the power reduction of the output light beam, having high light efficiency, having the output light beam with aligned polarization directions, and having a stable output can be obtained.

(2) Since it is possible to make the light beam enter the optical path conversion element 314 or to make the light beam be emitted from the optical path conversion element 314 via the surfaces 315A, 316C of the prisms 315, 316, it is easy to control the directions of the light beams entering the optical path conversion element 314 or emitted from the optical path conversion element 314.

It should be noted that although in the present embodiment the surface 315A of the first prism 315 and the surface 316C of the second prism 316 are parallel to each other, they do not have to be in parallel. However, if the surface 315A of the first prism 315 and the surface 316C of the second prism 316 are set parallel to each other as in the present embodiment, it is possible to make the direction of the light beam entering the optical path conversion element 314 and the direction of the light beam emitted from the optical path conversion element 314 the same, and accordingly, the control of the light beam directions becomes very easy.

(3) Since the surface 316A of the second prism 316 is the smoothed surface disposed at an angle satisfying the total reflection condition with the incident light beam IL, it becomes possible to have the reflective efficiency of the reflective surface of substantially 100%, thus further improving the efficiency of the light beam.

As shown in FIG. 1, it should be noted that it is possible to provide a reflective film 320 on the surface 316A to lead the second laser beam LS2 towards substantially the same direction as the proceeding direction of the first laser beam LS1 by this reflective film. In the case in which such a configuration is taken, although there is a possibility that the reflective efficiency is lowered to some extent, the surface 316A does not need to be disposed at an angle satisfying the total reflection conditions, and accordingly, an amount of freedom in designing the optical path increases.

(4) The laser source device 31 according to the present embodiment has a high probability of being applied in combination with other optical devices such as a lens, a filter, a mirror, a diffraction grating, a prism, a light modulation element, and the most of these optical devices are varied in the characteristics or changed in the output result depending on the angle of the incident light beam. However, since in the laser source device 31 according to the present embodiment, the first laser beam LS1 and the second laser beam LS2 are substantially parallel to each other, the design or disposition of the optical devices disposed posterior to the light source device becomes easy. Therefore, if the laser source device 31 according to the present embodiment is applied to an image display device, a monitor device, or the like, the advantage of dramatically increasing the amount of freedom of the optical design is obtained.

(5) Since W2>W1 is satisfied, even if there is caused a displacement in the relative positions of the first optical path O1 and the selectively reflective film 317, the second optical path O2 is not blocked by the wavelength conversion element 312. Therefore, the alignment of the optical path conversion element 314 becomes relatively easy.

(6) Since the wavelength conversion element 312 is a quasi phase control type of wavelength conversion element, which has higher conversion efficiency than other types of wavelength conversion elements, the advantage of (1) can further be enhanced.

Second Embodiment

Figure 6:
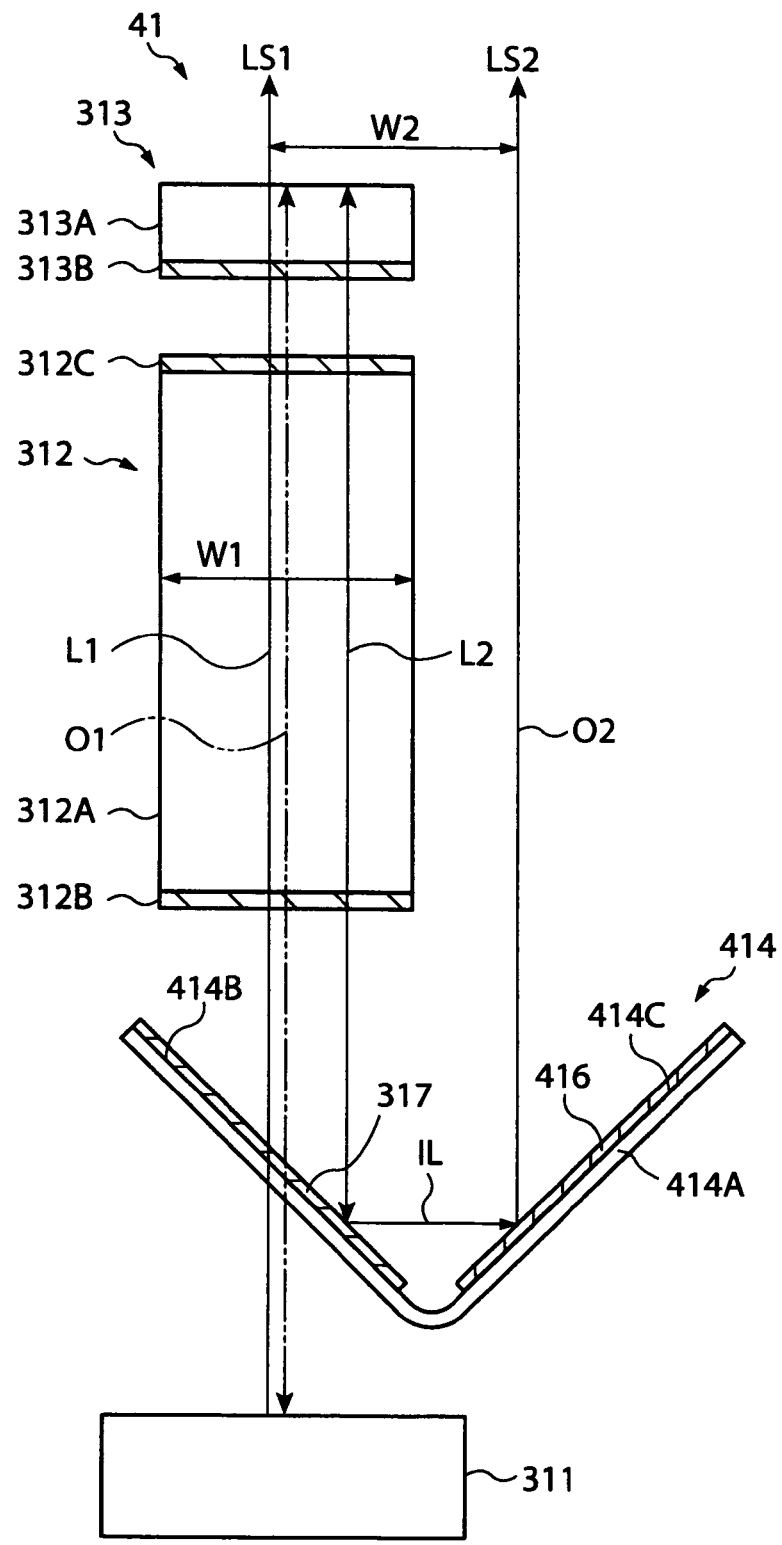
FIG. 6 is a schematic diagram showing a general configuration of a laser source device relating to a second embodiment.

FIG. 6 is a schematic diagram showing a general configuration of a laser source device 41 relating to a second embodiment. The laser source device 41 of the second embodiment is different from the laser source device 31 of the first embodiment only in the configuration of the optical path conversion element 414, and the same as the first embodiment except this point. Accordingly, in FIG. 6, the same members as in the first embodiment are denoted with the same reference, and the explanations therefor are omitted or simplified. Further, the process of obtaining the output light beam from the laser source device 41 is the same, and the detailed explanations are also omitted or simplified.

In the laser source device 41 shown in FIG. 6, the optical path conversion element 414 is provided with a plate-like member 414A as the translucent member, the selectively reflective film 317, and a reflective film 416. The plate-like member 414A is made of optical glass such as BK7, and has a shape of an L-shaped fold. It should be noted that the plate-like member 414A can be an integrated member formed by bonding two glass substrates arranged in L-shape with an optical adhesive. A surface 414B of the plate-like member 414A is provided with the selectively reflective film 317 formed thereon. Further, a second surface 414C of the plate-like member 414A is provided with a reflective film 416.

The reflective film 416 can be composed of a dielectric multilayer film similarly to the selectively reflective film 317. In this case, the dielectric multilayer film forming the reflective film 416 can be different from or same as that forming the selectively reflective film 317. Further, the reflective film 416 can be formed of a metal film such as aluminum, chromium, or silver. In general, a dielectric multilayer film is superior in heat resistance to a metal film. Further, the dielectric multilayer film can be improved in reflectance for a light beam with a specific wavelength by optimizing the thickness of each layer composing the film, the material of each layer, and the number of the layers, and is accordingly suitable for efficiently reflecting a light beam with a narrow wavelength band and a high directivity such as a laser beam. On the other hand, the metal film is more advantageous than the dielectric multilayer film on the cost front.

It should be noted that the selectively reflective film 317 and the reflective film 416 are preferably disposed nearer to the incident light beam than the plate-like member 414A, namely disposed on the wavelength conversion element 312 side surface of the plate-like member 414A considering the reflective efficiency, but it is possible to form it on the light source 311 side surface of the plate-like member 414A. Further, it is also possible to dispose either one of the selectively reflective film 317 and the reflective film 416 on the wavelength conversion element 312 side surface of the plate-like member 414A, and to form the other on the light source 311 side surface thereof. Further, it is preferable to form an anti-reflective (AR) film on the surface opposite to the surface provided with the selectively reflective film 317 or the reflective film 416 formed thereon. By forming the AR films on these surfaces, it becomes possible to reduce the light loss when the light beam enters the optical path conversion element 414 or is emitted from the optical path conversion element 414 through these surfaces.

A process to obtain the output light beam from the laser source device 41 will be explained next with reference to FIG. 6.

The light source 311 emits a light beam with a first wavelength. The light beam with the first wavelength emitted from the light source 311 enters the optical path conversion element 414, passes through the plate-like member 411A and the selectively reflective film 317, and is emitted towards the wavelength conversion element 312. The light beam with the first wavelength emitted from the optical path conversion element 414 enters the wavelength conversion element 312. In the wavelength conversion element 312, the wavelength of a part of the light beam with the first wavelength entering therein is converted into a wavelength (the second wavelength) half as large as the wavelength. The light beam converted into the second wavelength out of the light beams emitted from the wavelength conversion element 312 is transmitted through the external resonator 313, and then emitted from the external resonator 313 as the first laser beam LS1.

On the other hand, the light beam (the light beam with the first wavelength), which is not converted into the second wavelength, out of the light beams emitted from the wavelength conversion element 312 is reflected by the external resonator 313, and proceeds towards the light source 311. The light beam with the first wavelength reflected by the external resonator 313 is transmitted through the wavelength conversion element 312 again in the process of proceeding towards the light source 311. Then, a part of the light beam is converted into the second wavelength.

Then, the light beam emitted from the wavelength conversion element 312 towards the light source 311 enters the selectively reflective film 317.

The light beam with the first wavelength out of the light beams thus entering the selectively reflective film 317 is transmitted through the selectively reflective film 317. Then, the light beam with the first wavelength transmitted through the selectively reflective film 317 is emitted from the optical path conversion element 414 towards the light source 311.

Further, the light beam returns to the light source 311, and is reflected by the mirror layer provided inside thereof to be emitted again from the light source 311. As described above, the light beam with the first wavelength is amplified by resonating with the light beam newly emitted by oscillation of the laser medium 311B by reciprocating the first optical path O1 formed between the light source 311 and the external resonator 313. In other words, the laser source device 41 is provided with the resonance structure formed between the mirror layer provided inside the light source 311 and the external resonator 313.

On the other hand, the light, which is converted into the second wavelength by the wavelength conversion element 312 in the process that it is reflected by the external resonator 313 and then proceeds towards the light source 311, is reflected by the selectively reflective film 317.

Then, it is reflected by the reflection film 416 to be set towards a direction substantially parallel to the proceeding direction of the first laser beam LS1, and is emitted as the second laser beam LS2.

According to the laser source device 41 of the second embodiment, the following advantages can be obtained in addition to the advantages (1) and (4) through (6) of the first embodiment.

The lighter-weight optical path conversion element 414 than in the case in which the prism is used as the translucent member can be obtained. Further, the plate-like member can be processed more easily in comparison with the prism.

Therefore, it can contribute to weight saving and cost reduction of the laser source device.

Third Embodiment

Figure 7:
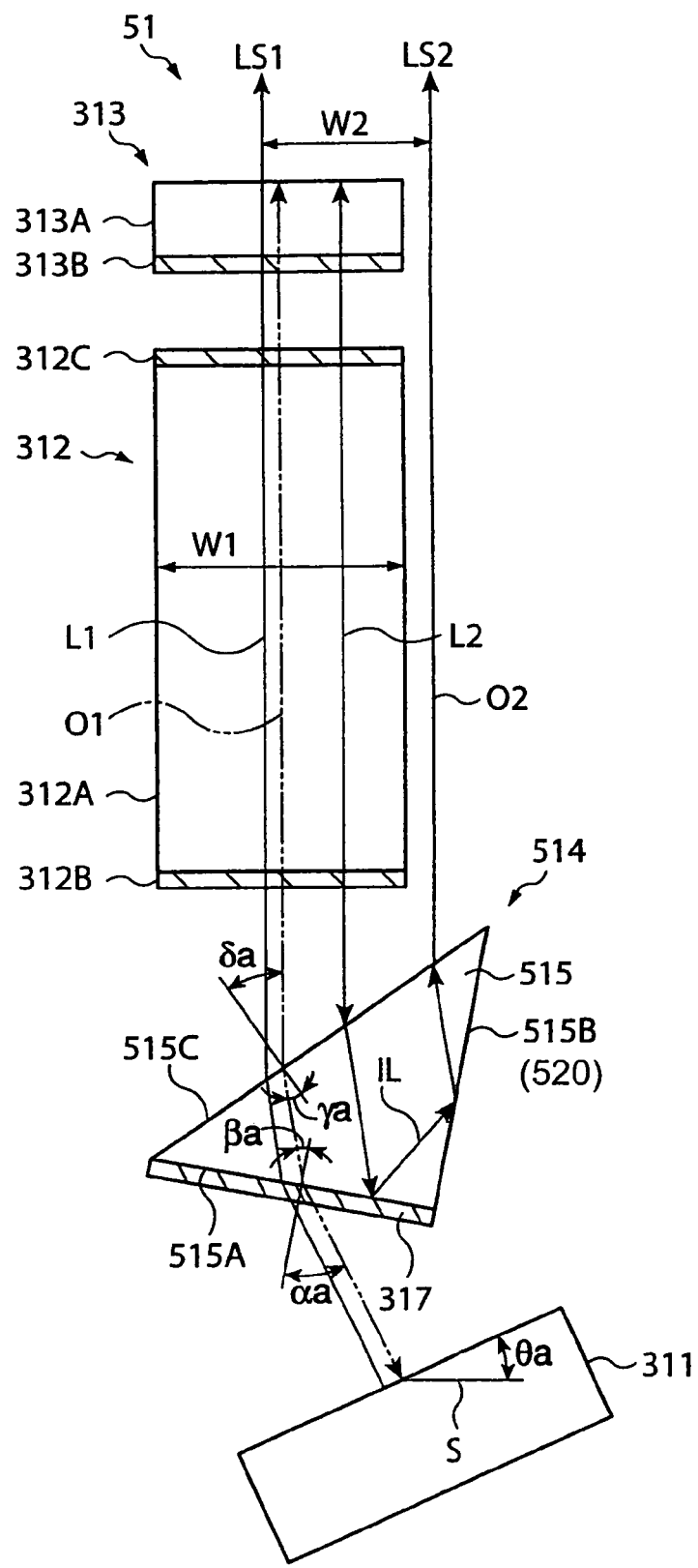
FIG. 7 is a schematic diagram showing a general configuration of a laser source device relating to a third embodiment.

FIG. 7 is a schematic diagram showing a general configuration of a laser source device relating to a third embodiment. The laser source device 51 of the third embodiment is different from the laser source device 31 of the first embodiment only in the configuration of the optical path conversion element 514, and the same as the first embodiment except this point. Accordingly, the same members as in the first embodiment are denoted with the same reference, and the explanations therefor are omitted or simplified. Further, the process of obtaining the output light beam from the laser source device 51 is the same, and the detailed explanations are also omitted or simplified.

In the laser source device 51 shown in FIG. 7, the optical path conversion element 514 is provided with a prism 515 as the translucent member and the selectively reflective film 317. The prism 515 is made of optical glass such as BK7, and has an isosceles triangular prism shape. The side surfaces of the prism 515 is composed of surfaces 515A, 515B including two sides forming the apex angle of the isosceles triangle and a surface 515C including the hypotenuse. A surface 515A of the prism is provided with the selectively reflective film 317 formed thereon. The surface 515A is disposed so that the light beam emitted from the light source 311 enters at an incident angle αa.

A surface 515B of the prism 515 is a smoothed surface disposed at an angle satisfying the total reflection condition with respect to the incident light beam IL. Further, a surface 515C of the prism 515 is disposed so that the light beam reflected by the external resonator 313 and proceeding towards the light source 311 enters at an incident angle δa.

It should be noted that the surface 515C of the prism 515 can be provided with an anti-reflective (AR) film formed thereon. By forming the AR film on this surface 515C, it becomes possible to reduce the light loss when the light beam enters the optical path conversion element 514 or is emitted from the optical path conversion element 514 through this surface 515C.

A process to obtain the output light beam from the laser source device 51 will be explained next with reference to FIG. 7.

The light source 311 emits a light beam with the first wavelength. The light source 311 is disposed so that the surface of the mirror layer provided inside thereof is tilted at an angle θa with respect to a plane (a plane perpendicular to the sheet face of FIG. 7) S perpendicular to the laser beams L1 and L2. The light beam with the first wavelength emitted from the light source 311 enters the optical path conversion element 514 from the surface 515A of the prism via the selectively reflective film 317. The incident angle of the light beam with respect to the selectively reflective film 317 and the surface 515A of the prism 515 is δa.

The light beam entering the surface 515A of the prism 515 at the incident angle αa is refracted in a direction at an angle βa with the normal line of the surface 515A in accordance with the refractive index difference between air and the prism 515, and proceeds inside the prism 515.

Then, it enters the surface 515C of the prism 515 at an incident angle γa, and is emitted from the surface 515C of the prism 515 towards the wavelength conversion element 312.

The light beam emitted from the surface 515C of the prism 515 is refracted in a direction at an angle δa with the normal line of the surface 515C in accordance with the refractive index difference between the prism 515 and air, and led towards the wavelength conversion element 312.

As described above, the light beam with the first wavelength emitted from the optical path conversion element 514 enters the wavelength conversion element 312. In the wavelength conversion element 312, the wavelength of a part of the light beam with the first wavelength entered therein is converted into a wavelength (the second wavelength) half as large as the wavelength. The light beam converted into the second wavelength out of the light beams emitted from the wavelength conversion element 312 is transmitted through the external resonator 313, and then emitted from the external resonator 313 as the first laser beam LS1.

On the other hand, the light beam (the light beam with the first wavelength), which is not converted into the second wavelength, out of the light beams emitted from the wavelength conversion element 312 is reflected by the external resonator 313, and proceeds towards the light source 311. The light beam with the first wavelength reflected by the external resonator 313 is transmitted through the wavelength conversion element 312 again in the process of proceeding towards the light source 311. Then, a part of the light beam is converted into the second wavelength.

Then, the light beam emitted from the wavelength conversion element 312 towards the light source 311 enters the optical path conversion element 514 from the surface 515C of the prism 515. In this case, the incident angle of the light beam with the surface 515C is δa. The light beam entering the optical path conversion element 514 from the surface 515C is refracted in a direction at an angle γa with the normal line of the surface 515C in accordance with the refractive index difference between air and the prism 515, and proceeds inside the prism 515. Then, it enters the selectively reflective film 317 via the surface 515A. In this case, the incident angle of the light beam with the surface 515A is βa.

The light beam with the first wavelength out of the light beams thus entering the selectively reflective film 317 is transmitted through the selectively reflective film 317. Then, the light beam with the first wavelength transmitted through the selectively reflective film 317 is emitted from the optical path conversion element 514 towards the light source 311. This emitted light beam is refracted to a direction at an angle αa with the normal line of the surface 515A in accordance with the refractive index difference between the prism 515 and air, and proceeds towards the light source 311.

Further, the light beam returns to the light source 311, and is reflected by the mirror layer provided inside thereof to be emitted again from the light source 311.

As described above, the light beam with the first wavelength is amplified by resonating with the light beam newly emitted by oscillation of the laser medium provided inside the light source by reciprocating the first optical path O1 formed between the light source 311 and the external resonator 313. In other words, the laser source device 51 is provided with the resonance structure formed between the mirror layer provided inside the light source 311 and the external resonator 313.

On the other hand, the light, which is converted into the second wavelength by the wavelength conversion element 312 in the process that it is reflected by the external resonator 313 and then proceeds towards the light source 311, is reflected by the selectively reflective film 317. Then, it is reflected by the surface 515B of the prism 515 to be set towards a direction parallel to the proceeding direction of the first laser beam LS1, and is emitted from the surface 515C of the prism 515 as the second laser beam LS2.

It should be noted that the angles θa, αa, βa, γa, and δa can be set as follows assuming that, for example, the refractive index of air is n=1, and the refractive index of the prism is n=15: θa=65°; αa=35°; βa=22.5°; γa=22.5°; and δa=35°. These angles can appropriately be changed in accordance with the refractive index of the prism 515, the tilt angles of the surfaces 515A, 515B, and 515C.

Figure 8:
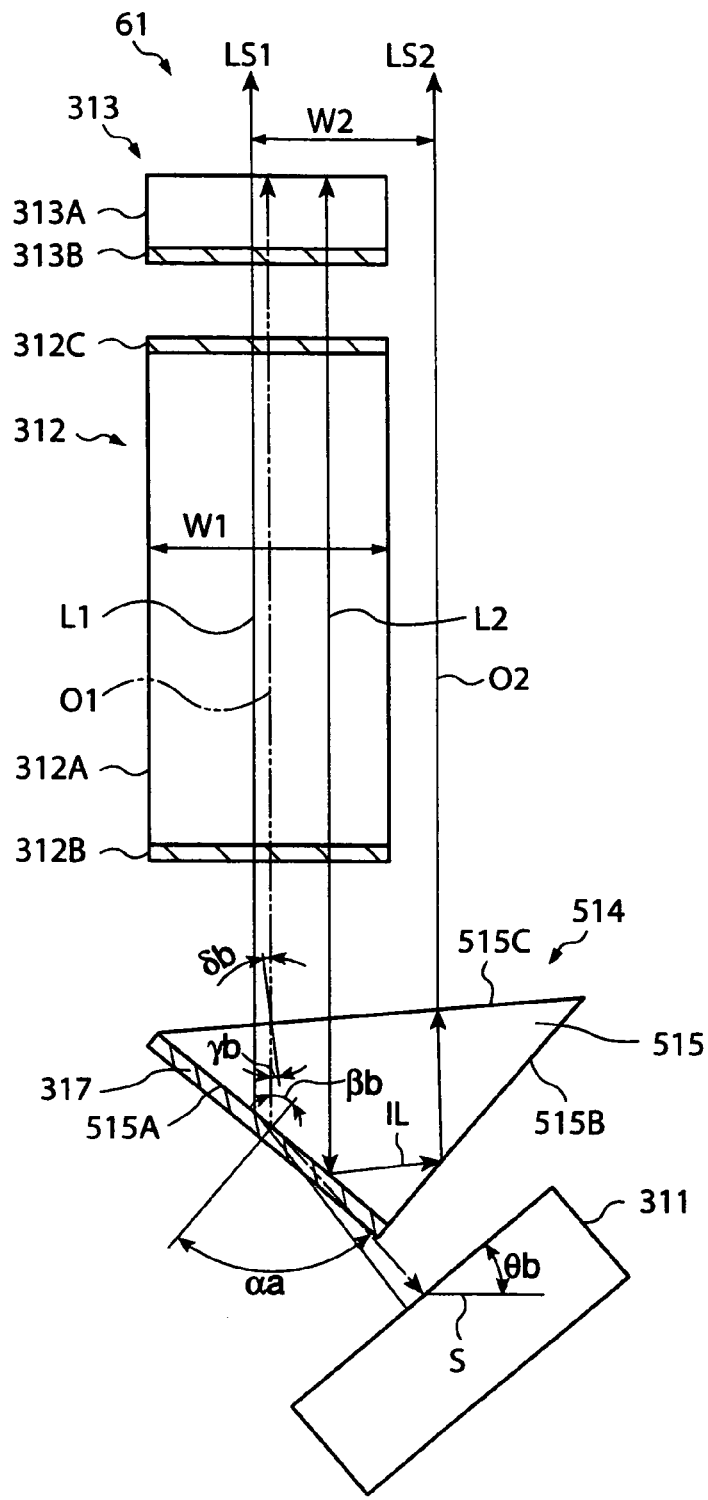
FIG. 8 is a schematic diagram showing a general configuration of a laser source device of a modified example of the third embodiment.

FIG. 8 is a schematic diagram showing a general configuration of a laser source device 61 of a modified example of the third embodiment, and shows an example in which the angles θa, αa, βa, γa, and δa are changed to other values of θb, αb, βb, γb, and δb, respectively. Other portions than the point of changing the angles θa, αa, βa, γa, and δa to θb, αb, βb, γb, and δb, respectively, are the same as in the laser source device 51 of FIG. 7.

In the laser source device 61 of FIG. 8, angles θb, αb, βb, γb, and δb are set as follows: θb=41.7°; αb=88°; βb=41.7°; γb=3.3°; and δb=5.0°.

According to the laser source devices 51, 61 of the third embodiment as described above, the following advantages can be obtained in addition to the advantages (1) and (4) through (6) of the first embodiment.

Since the optical path conversion element 514 can be composed of only one prism 515 and the selectively reflective film 317, the number of composing parts is reduced, thus contributing to the cost reduction of the laser source devices 51, 61.

Since the surface 515B of the prism 515 is the smoothed surface disposed at an angle satisfying the total reflection condition with the incident light beam IL, it becomes possible to have the reflective efficiency of the reflective surface of substantially 100%, thus further improving the efficiency of the light beam.

As shown in FIG. 7, it should be noted that it is possible to provide a reflective film 520 on the surface 515B to lead the second laser beam LS2 towards substantially the same direction as the proceeding direction of the first laser beam LS1 by this reflective film. In the case in which such a configuration is taken, although there is a possibility that the reflective efficiency is lowered to some extent, the surface 515B does not need to be disposed at an angle satisfying the total reflection conditions, and accordingly, an amount of freedom in designing the optical path increases.

Modified Examples of Embodiments

Note that the invention is not limited to the first embodiment through the third embodiment described above, but includes modifications and improvements in a range where the objects of the invention can be achieved. Even in the forms cited as modified examples below, the same advantages as in the embodiments described above can be obtained.

As the light source 311, a so-called edge emission type semiconductor laser or a semiconductor-excited solid state laser can also be used besides the surface emission type semiconductor laser. It should be noted that in the case in which the edge emission type semiconductor laser is used, a lens for collimating the light beam emitted from the light source 311 is preferably disposed between the light source 311 and the optical path conversion element 314, 414, 514, and 515.

Figure 9A:
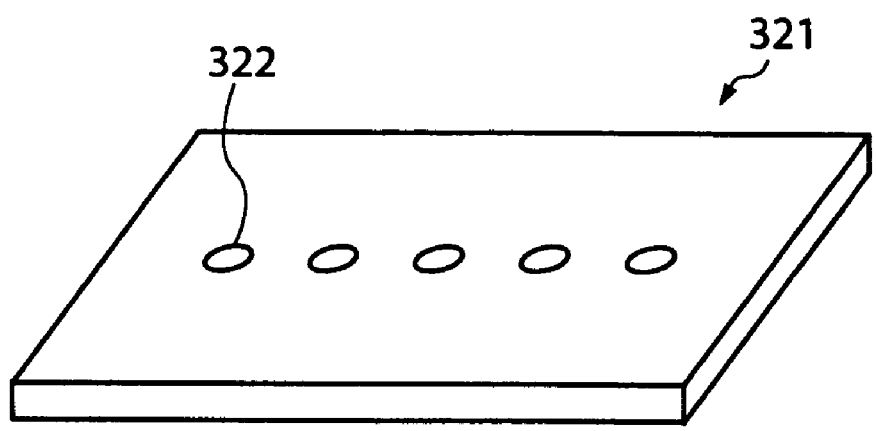
FIG. 9 is a schematic diagram showing a light source having light emitting sections disposed as an array.
Figure 9B:
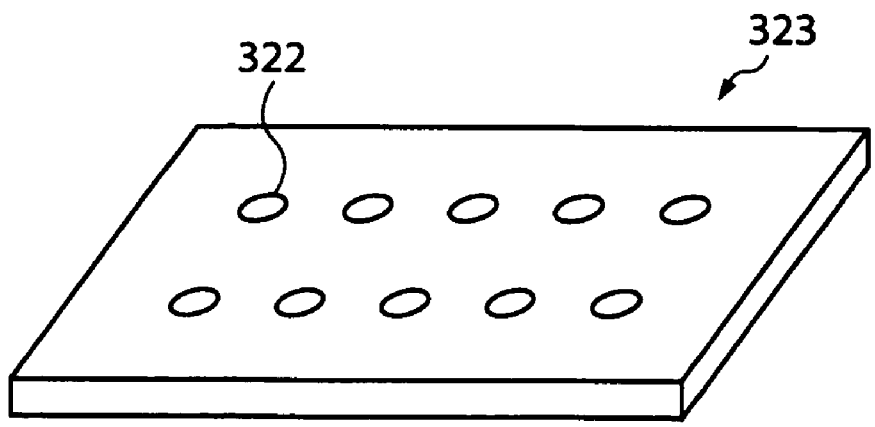

Further, the light source 311 can be what is provided with a plurality of light emitting sections disposed as an array. FIGS. 9(A) and 9(B) are both schematic diagrams each showing a light source having the light emitting sections disposed as an array. In the light source 321 of FIG. 9(A), a plurality of light emitting sections 322 is arranged in a line. Further, in the light source 323 of FIG. 9(B), a plurality of light emitting sections 322 is arranged in two lines. It should be noted that the number of light emitting sections or the number of lines are not limited to those shown in FIGS. 9(A) and 9(B). In the laser source devices 31, 41, 51, and 61 described above, even if such a light source with the light emitting sections disposed as an array is used, it is sufficient only to extend the areas of the light entrance and emission end surfaces of the selectively reflective film, the reflective surface, the wavelength selection element, and the external resonator to the areas corresponding to the array.

As described above, in the laser source devices 31, 41, 51, and 61 described above, even if the light source is formed as an array, it is possible to cope with the light source with a simple configuration without causing any excessive growth in size of the device. Therefore, in the laser source devices 31, 41, 51, and 61 described above, even if the light source is formed as an array, it is possible to make increase in the amount of light derived from using the array efficiently lead improvement of the power of the output light beam while keeping the advantage of making it possible to provide the laser source device capable of efficiently suppressing the power reduction of the output light beam, having high light efficiency, having the output light beam with aligned polarization directions, and having a stable output.

Although LN ($LiNbO_3$) and LT ($LiTaO_3$) are previously exemplified as the nonlinear optical material composing the wavelength conversion element 312, besides these materials, inorganic nonlinear optical materials such as $KNbO_3$, BNN ($Ba_2NaNb_5O_{15}$), KTP ($KTiOPO_4$), KTA ($KTiOAsO_4$), BBO ($\beta$-$BaB_2O_4$), LBO ($LiB_3O_7$) can also be used. Further, small molecule organic materials such as metanitroaniline, 2-methyl-4-nitroaniline, chalcone, dicyanovinyl-anisole, 3,5-dimethyl-1-(4-nitrophenyl) pyrasole, or N-methoxymethyl-4-nitroaniline, and organic nonlinear optical materials such as poled polymer can also be used.

As the wavelength conversion element 312, a third harmonic wave generation element can also be used instead of the SHG element described above.

As the external resonator 313, besides the volume phase grating explained previously, crystal volume hologram, photopolymer volume hologram, blazed diffraction grating (a diffraction grating having a sawtooth shape of the groove cross section) and so on can also be used.

Application Examples of Laser Source Device

By applying the laser source devices 31, 41, 51, and 61 as described above to an image display device or a monitor device, the light efficiency in these devices can be improved. Application examples to the image display device and to the monitor device will hereinafter be explained.

First Application Example: Projector

Figure 10:
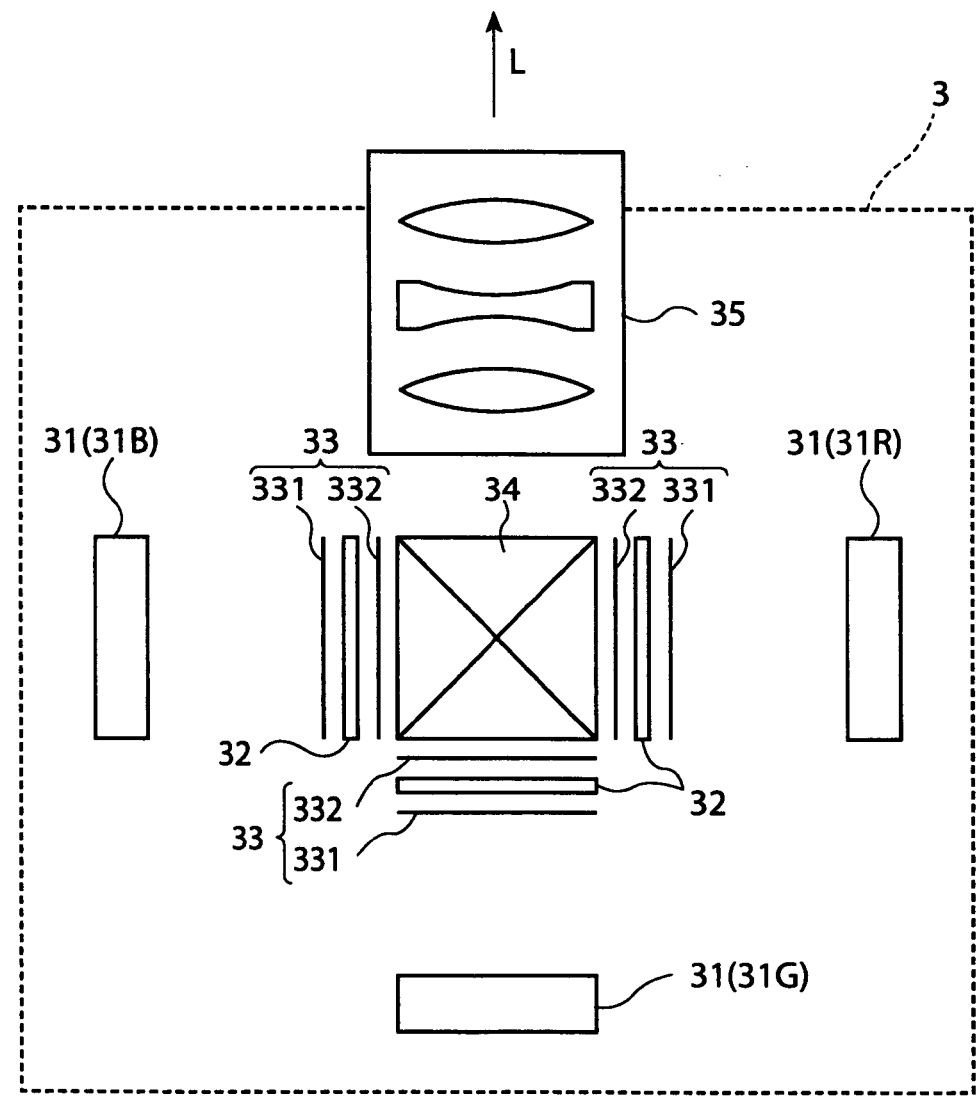
FIG. 10 is a schematic diagram showing an outline of an optical system of a projector.

An example of an image display device applying the laser source device 31 according to the first embodiment, the configuration of a projector 3 will now be explained. FIG. 10 is a schematic diagram showing an outline of an optical system of the projector 3.

In FIG. 10, the projector 3 is provided with the laser source device 31, a liquid crystal panel 32 as a light modulation device, polarization plates 331, 332, a cross dichroic prism 34, a projection lens 35, and so on. It should be noted that a liquid crystal light valve 33 is composed of the liquid crystal panel 32, the polarization plate 331 disposed on the light entrance side thereof, and the polarization plate 332 disposed on the light emission side thereof.

The laser source device 31 is provided with a red light source device 31R for emitting a red laser beam, a blue light source device 31B for emitting a blue laser beam, and a green light source device 31G for emitting a green laser beam. These light source devices 31 (31R, 31G, and 31B) are disposed so as to respectively face three side surfaces of the cross dichroic prism 34. In FIG. 10, across the cross dichroic prism 34, the red light source device 31R and the blue light source device 31B face each other, and the projection lens 35 and the green light source device 31G face each other, but these positions can arbitrarily be counterchanged.

The liquid crystal panel 32 uses, for example, a polysilicon thin film transistor (TFT) as a switching element. The colored light beam emitted from each of the laser source devices 31 enters the liquid crystal panel 32 via the entrance side polarization plate 331. The light beam entering the liquid crystal panel 32 is modulated in accordance with image information, and emitted from the liquid crystal panel 32. Only a specific linear polarized light beam out of the light beam modulated by the liquid crystal panel 32 is transmitted through the emission side polarization plate 332 to proceed towards the cross dichroic prism 34.

It should be noted that since the light beam emitted from the laser source device 31 is a light beam having a well-aligned polarization direction, it is possible to eliminate the entrance side polarization plate 331, in principle. However, in actuality, there are few cases in which the light beam emitted from the laser source device 31 is used directly as an illumination light beam, and an optical element (e.g., diffraction grating, a lens, a rod integrator, and so on) for processing the light beam emitted from the laser source device 31 into the light beam suitable for the illumination light beam is often disposed between the light source device 31 and the liquid crystal panel 32. Further, there is also a possibility that a few turbulences are caused in the polarized light beam by passing through such an optical element. If the light beam with disturbed polarization is allowed to directly enter the liquid crystal panel 32, there is also a possibility of degradation of the contrast of the projected image or generation of color shading in the projected image. Therefore, by providing the polarization plate 331 in the entrance side of the liquid crystal panel 32 to align the direction of polarized light beam entering the liquid crystal panel 32, the degradation of the contrast of the projected image or the generation of the color shading can be suppressed, thus the higher quality image can be obtained.

The cross dichroic prism 34 is an optical element for combining each of the colored light beams modulated by respective liquid crystal panel 32, thereby forming a color image. This cross dichroic prism 34 has a square shape in the plan view formed by bonding four rectangular prisms. Further, on the boundaries of these four rectangular prisms, there are provided two kinds of dielectric multilayer films in an X-shape. These dielectric multilayer films reflect each colored light beam emitted from the respective one of the liquid crystal panels 32 facing each other, and transmits the colored light beam emitted from the liquid crystal panel 32 facing the projection lens 35. Each of the colored light beams modulated by the respective one of the liquid crystal panel 32 is thus combined to form a color image.

The projection lens 35 is configured as a combination lens in which a plurality of lenses is combined. This projection lens 35 enlargedly projects a color image L.

It should be noted that, although in the present application example, the laser source devices 31 (31R, 31G, and 31B) are used, it is also possible to replace a part or all of them with the laser source device 41, 51, or 61 according to other embodiments.

Further, it is also possible to replace a part of the laser source devices 31R, 31G, and 31B with a laser source device using the wavelength of the fundamental laser as it is.

Although in the present application example, an example of the projector using three light modulation elements is explained, the laser source devices 31, 41, 51, and 61 of the first through third embodiments can also be applied to a projector using one, two, or four or more light modulation devices.

Further, although in the present application example, the transmissive projector is explained, the laser source devices 31, 41, 51, and 61 of the first through third embodiments can also be applied to a reflective projector. It should be noted here that "transmissive" denotes that the light modulation element is a type of transmitting a light beam, and "reflective" denotes that the light modulation element is a type of reflecting a light beam.

Further, the light modulation element is not limited to the liquid crystal panel 32, and can be a device using, for example, a micro mirror.

Further, as a projector, there are cited a front type, which projects an image from a direction in which the projection screen is observed, and a rear type, which projects an image from the opposite direction to the direction in which the projection screen is observed. The laser source devices 31, 41, 51, and 61 of the first through third embodiments can be applied to both types.

Further, although in the present application example, the projector provided with the projection lens 35 for enlargedly projecting an image is introduced as an example of the image display device applying the laser source device 31, the laser source devices 31, 41, 51, and 61 of the first through third embodiments can also be applied to image display devices not using the projection lens 35.

Second Application Example: Monitor Device

Figure 11:
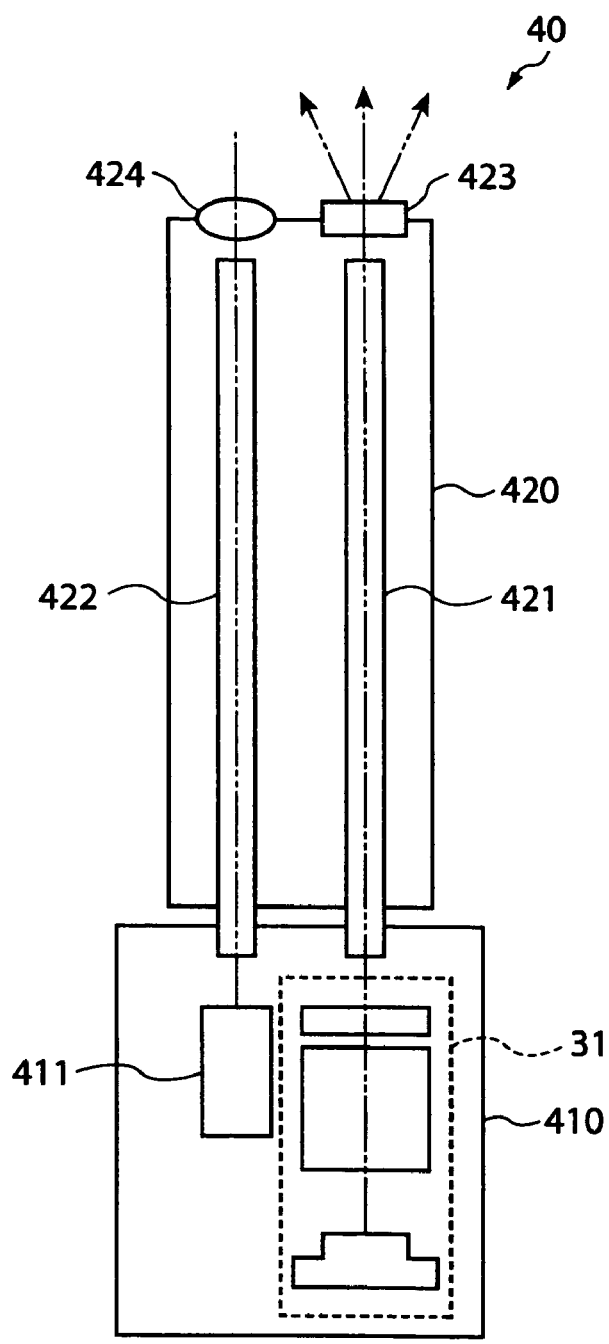
FIG. 11 is a schematic diagram showing an outline of a monitor device.

A configuration example of a monitor device 40 applying the laser source device 31 according to the first embodiment will now be explained. FIG. 11 is a schematic diagram showing an outline of a monitor device. The monitor device 40 is provided with a device main body 410 and an optical transmission section 420. The device main body 410 is provided with the laser source device 31 of the first embodiment described above.

The optical transmission section 420 is provided with two light guides 421, 422 of a light transmission side and a light reception side, respectively. Each of the light guides 421, 422 is a bundle of a number of optical fibers, and is capable of transmitting a laser beam over a long distance. On the entrance side of the light guide 421 of the light transmission side, there is disposed the laser source device 31, while on the emission side thereof there is disposed a diffusion plate 423. The laser beam emitted from the laser source device 31 is transmitted to the diffusion plate 423 disposed on the tip of the light transmission section 420 through the light guide 421, and is diffused by the diffusion plate 423 to irradiate an object.

On the tip of the light transmission section 420, there is also provided an imaging lens 424, and the reflected light from the object can be received by the imaging lens 424. The received reflected light is transmitted through the light guide 422 of the light reception side to a camera 411 as image pickup means disposed inside the device main body 410. As a result, the reflected light obtained by irradiating the object with the laser beam emitted from the laser source device 31 can be imaged by the camera 411.

According to the monitor device 40 configured as described above, since the object can be irradiated with the high power laser source device 31, the brightness of the image taken by the camera 411 can be enhanced.

It should be noted that, although in the present application example, the laser source devices 31 is used, it is also possible to replace it with the laser source device 41, 51, or 61 according to other embodiments.

The invention claimed is:

1. A laser source device, comprising:
    a light source that emits a light beam with a first wavelength;
    an external resonator that selectively reflects the light beam with the first wavelength towards the light source;
    a wavelength conversion element that converts a wavelength of a part of the light beam with the first wavelength into a second wavelength different from the first wavelength, the wavelength conversion element being disposed on a first optical path formed between the light source and the external resonator; and
    an optical path conversion element that guides the part of the light beam converted into the second wavelength to a second optical path different from the first optical path;
    the light beam with the second wavelength passing through the external resonator;
    a first laser beam with the second wavelength emitted from the external resonator and a second laser beam with the second wavelength emitted from the optical path conversion element away from the light source being used as an output light beam; and
    the optical path conversion element including:
        a selectively reflective film that selectively reflects the light beam with the second wavelength, the selectively reflective film being disposed between the light source and the wavelength conversion element,
        a reflective surface that reflects the light beam reflected by the selectively reflective film to guide the light beam in a direction substantially the same as the proceeding direction of the first laser beam, and
        a translucent element that integrates the selectively reflective film and the reflective surface,
        the translucent element comprising a prism with a first surface, a second surface, and a third surface,
        the selectively reflective film being disposed on the first surface,
        the light beam emitted from the light source entering the optical path conversion element from the first surface via the selectively reflective film, and being emitted from the second surface towards the wavelength conversion element,
        the part of the light beam reflected by the external resonator and proceeding towards the light source that enters the optical path conversion element from the second surface, passes through the first surface, and enters the selectively reflective film,
        the part of the light beam transmitted through the selectively reflective film proceeding towards the light source, and
        the part of the light beam reflected by the selectively reflective film being reflected by the third surface, and being emitted from the second surface.

2. The laser source device according to claim 1, the reflective surface being the third surface, and the third surface being disposed at an angle satisfying a total reflection condition with the incident light beam to the third surface.

3. The laser source device according to claim 1, the reflective surface being a reflective film disposed on the third surface.

4. The laser source device according to claim 1, the first laser beam with the second wavelength emitted from the external resonator and the second laser beam with the second wavelength emitted from the optical path conversion element that are substantially parallel to each other.

5. The laser source device according to claim 4, the condition W2>W1 being satisfied, where W1 is a width of the wavelength conversion element in the direction parallel to a line perpendicular to the first laser beam and the second laser beam, and W2 is a distance between the first laser beam and the second laser beam.

6. The laser source device according to claim 1, the light source including a plurality of light emitting sections disposed as an array.

7. The laser source device according to claim 1, the wavelength conversion element being a quasi phase control type of wavelength conversion element.

8. An image display device comprising:
    the laser source device according to claim 1; and
    a light modulation element that modulates a laser beam emitted from the laser source device in accordance with image information.

9. A monitor device comprising:
    the laser source device according to claim 1; and
    an image pickup device that images an object irradiated by the laser source device.

10. A laser source device, comprising:
    a light source that emits light with a first wavelength on a first optical path;
    a wavelength conversion element that converts a part of the light with the first wavelength into light with a second wavelength;
    an external resonator that reflects the light with the first wavelength, and allows the light with the second wavelength to pass through the external resonator, the light with the second wavelength that passes through the external resonator being a first laser beam; and
    an optical path conversion element disposed between the light source and the wavelength conversion element, the optical path conversion element allowing the light with the first wavelength to pass through the optical path conversion element, and guiding the light with the second wavelength away from the light source on a second optical path different from the first optical path, the light with the second wavelength guided away from the light source on a second optical path being a second laser beam,
    the optical path conversion element including:
        a selectively reflective film that selectively reflects the light beam with the second wavelength, the selectively reflective film being disposed between the light source and the wavelength conversion element,
        a reflective surface that reflects the light beam reflected by the selectively reflective film to guide the light beam in a direction substantially the same as the proceeding direction of the first laser beam, and
        a translucent element that integrates the selectively reflective film and the reflective surface,
        the translucent element comprising a prism with a first surface, a second surface, and a third surface, the selectively reflective film being disposed on the first surface, the light beam emitted from the light source that enters the optical path conversion element from the first surface via the selectively reflective film, and is emitted from the second surface towards the wavelength conversion element, the part of the light beam reflected by the external resonator and proceeding towards the light source that enters the optical path conversion element from the second surface, passes through the first surface, and enters the selectively reflective film, the part of the light beam transmitted through the selectively reflective film proceeding towards the light source, and the part of the light beam reflected by the selectively reflective film being reflected by the third surface, and being emitted from the second surface.

11. The laser source device according to claim 10, the light source further comprising a mirror layer, the light beam with the first wavelength returning to the light source and being reflected by the mirror layer to be emitted again by the light source.

12. The laser source device according to claim 10, the first optical path and the second optical path being in parallel.

13. The laser source device according to claim 10, the second optical path bypassing the wavelength conversion element and the external resonator.

14. The laser source device according to claim 10,
the third surface guiding the light beam in a direction substantially parallel to the first laser beam.

15. An image display device comprising:
the laser source device according to claim 10; and
a light modulation element that modulates a laser beam emitted from the laser source device in accordance with image information.

16. A monitor device comprising:
the laser source device according to claim 10; and
image pickup devices that images an object irradiated by the laser source device.

* * * * *